(12) United States Patent
Cantwell et al.

(10) Patent No.: US 9,934,351 B2
(45) Date of Patent: Apr. 3, 2018

(54) WAFER POINT BY POINT ANALYSIS AND DATA PRESENTATION

(71) Applicant: Applied Materials, Inc., Santa Clara, CA (US)

(72) Inventors: Dermot Cantwell, Sunnyvale, CA (US); Sathyendra Ghantasala, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 240 days.

(21) Appl. No.: 14/936,559

(22) Filed: Nov. 9, 2015

(65) Prior Publication Data

US 2017/0132352 A1 May 11, 2017

(51) Int. Cl.
*G06F 17/50* (2006.01)
*G03F 7/20* (2006.01)

(52) U.S. Cl.
CPC .......... *G06F 17/5081* (2013.01); *G03F 7/705* (2013.01)

(58) Field of Classification Search
CPC .......... G03F 7/70; G03F 7/705; G03F 7/0037; G03F 7/70525; G03F 7/7065; G06F 17/5081; G01B 2210/56; G01N 21/9501
USPC ............................................. 716/52–55, 136
See application file for complete search history.

(56) References Cited

U.S. PATENT DOCUMENTS

| | | |
|---|---|---|
| 6,407,396 B1 | 6/2002 | Mih et al. |
| 7,089,075 B2 | 8/2006 | Hasan |
| 7,283,882 B1 | 10/2007 | Bransky et al. |
| 2003/0014145 A1 | 1/2003 | Reiss et al. |
| 2004/0092047 A1 | 5/2004 | Lymberopoulos et al. |
| 2006/0015206 A1 | 1/2006 | Funk et al. |
| 2008/0072207 A1* | 3/2008 | Verma .................. G03F 1/84 716/52 |
| 2008/0124818 A1 | 5/2008 | Li et al. |

(Continued)

FOREIGN PATENT DOCUMENTS

CN           100479095 C    4/2009

OTHER PUBLICATIONS

International Searching Authority, "Notification of Transmittal of the International Search Report and the Written Opinion of the International Searching Authority, or the Declaration," for International Application No. PCT/US2016/061168, dated Feb. 23, 2017, 10 pages.

*Primary Examiner* — Paul Dinh
(74) *Attorney, Agent, or Firm* — Lowenstein Sandler LLP

(57) ABSTRACT

A method for wafer point by point analysis includes receiving first recipe parameters for a first process recipe, second recipe parameters for a second process recipe, a first plurality of measurements of a plurality of locations on a first wafer processed using the first process recipe, and a second plurality of measurements of the plurality of locations on a second wafer processed using the second process recipe. A plurality of sensitivity values are calculated using the first and second values for the plurality of recipe parameters and the first and second plurality of measurements, each of the plurality of sensitivity values corresponding to one of the plurality of locations and representing a sensitivity to one of the plurality of recipe parameters. A graphical representation of a wafer is then provided that shows at least a subset of the first plurality of sensitivity values for the plurality of locations.

20 Claims, 7 Drawing Sheets

(56) References Cited

U.S. PATENT DOCUMENTS

2008/0250384 A1* 10/2008 Duffy .................... G03F 7/7065
   716/55
2013/0011939 A1   1/2013 Chan et al.

* cited by examiner

WAFER POINT BY POINT ANALYSIS AND DATA PRESENTATION

FIELD OF THE INVENTION

Embodiments of the present invention generally relate to augmenting existing wafer analysis to perform wafer point by point Design of Experiments (DOE) analysis.

BACKGROUND OF THE INVENTION

The continued demand for higher personal computer processing speed calls for increasingly smaller features on wafers. The demand for smaller features places greater demands on optical lithography systems and the associated metrology of wafers. With features becoming exponentially smaller, geometrical uniformity throughout a wafer is becoming increasingly useful.

Sensitivity analysis is a technique used to determine how different values of an independent variable will impact a particular dependent variable (e.g. wafer film thickness) under a given set of conditions (chamber parameters). Sensitivity analysis on wafers is beneficial to determine how different wafer recipe parameters affect wafer film thickness, for example.

Typically, sensitivity analysis outputs are viewed and analyzed in terms of a single, average sensitivity across an entire wafer. More sophisticated methods provide radial sensitivity values across a wafer, where sensitivity values are determined for several radial intercepts across the wafer.

SUMMARY

The following is a simplified summary of the disclosure in order to provide a basic understanding of some aspects of the disclosure. This summary is not an extensive overview of the disclosure. It is intended neither to identify key or critical elements of the disclosure, nor to delineate any scope of the particular implementations of the disclosure or any scope of the claims. Its sole purpose is to present some concepts of the disclosure in a simplified form as a prelude to the more detailed description that is presented later.

Embodiments of the present invention provide improved methods, systems and software for wafer point by point analysis to analyze design of experiments (DOE) data.

In one embodiment, point by point analysis of a wafer includes receiving first values for a plurality of recipe parameters associated with a first process recipe and receiving a first plurality of measurements of a plurality of locations on a first wafer processed using the first process recipe. Embodiments may further include receiving second values for the plurality of recipe parameters associated with a second process recipe, and receiving a second plurality of measurements of a plurality of the plurality of locations on a second wafer processed using the second process recipe. An embodiment may further include calculating a plurality of sensitivity values using the first values for the plurality of recipe parameters, the second values for the plurality of recipe parameters, the first plurality of measurements, and the second plurality of measurements. In various embodiments, each of the plurality of sensitivity values may correspond to one of the plurality of locations and represent sensitivity to one of the plurality of recipe parameters. Additionally, in one embodiment, the method includes providing a graphical representation of a wafer that shows at least a subset of the first plurality of sensitivity values for the plurality of locations.

Furthermore, embodiments of the present disclosure relate to a DOE analysis system including a memory to store a plurality of DOE parameters and values and a processing device, operatively coupled to the memory. In one embodiment the processing devices is to perform the operations listed above. In another embodiment, a non-transitory machine-readable storage medium includes instructions that, when accessed by a processing device, cause the processing device to perform the above operations.

BRIEF DESCRIPTION OF THE DRAWINGS

Various embodiments of the present invention will be understood more fully from the detailed description given below and from the accompanying drawings of various embodiments of the invention.

DETAILED DESCRIPTION

Embodiments of the present disclosure provide improved methods, systems and software for wafer point by point analysis to analyze Design of Experiments (DOE) data. In one example illustration, recipe parameter values for a DOE are analyzed and corresponding sensitivity values are displayed on a point by point basis. Sensitivity values associated with measured wafer locations may be displayed on two-dimensional or three dimensional contour maps.

Wafer sensitivity analysis techniques, such as DOE, may be used in the semiconductor industry. In various embodiments, DOE techniques are used to detect wafer sensitivity in view of changing recipe parameters. DOE is the design of any information-gathering exercise where variation is present. DOE analysis is the analysis of data generated from execution of a DOE (DOE data). In one embodiment, DOE data includes recipe parameters, recipe parameter values, and wafer measurements. In one embodiment, for a wafer sensitivity DOE analysis in which five recipe parameters may be varied, a DOE can be performed by running multiple experiments where each of the five recipe parameters is varied according to predetermined values for each experiment. Wafers from each experiment may then be measured at various locations and associated with their corresponding recipe parameters. Sensitivity values may be calculated by comparing the variation in recipe parameters to the variation in measurements from each measured location, from each of the experiments. Sensitivity values are then commonly averaged to determine a wafer's average sensitivity to a particular recipe parameter. Uncommonly, sensitivity may be calculated corresponding to averaged radial sensitivity values across a wafer.

Using a single, average sensitivity value for a wafer or several radial sensitivity values is problematic because both techniques abstract out specific, valuable sensitivity information. For example, a wafer might be very sensitive on one side of the wafer with a positive dependence to a recipe parameter. The same wafer may be equally sensitive on the other side of the wafer but with a negative dependence to the recipe parameter. In such an instance, both the mean and averaged radial sensitivity output values would incorrectly show sensitivity values of zero.

Described are embodiments of methods and systems that perform sensitivity analysis on a point by point basis across a wafer. By performing the sensitivity analysis on a point by point basis for measured locations on a wafer and presenting the sensitivity analysis as a contour map, wafer sensitivity can be thoroughly visualized and analyzed with high levels of accuracy.

Figure 1:
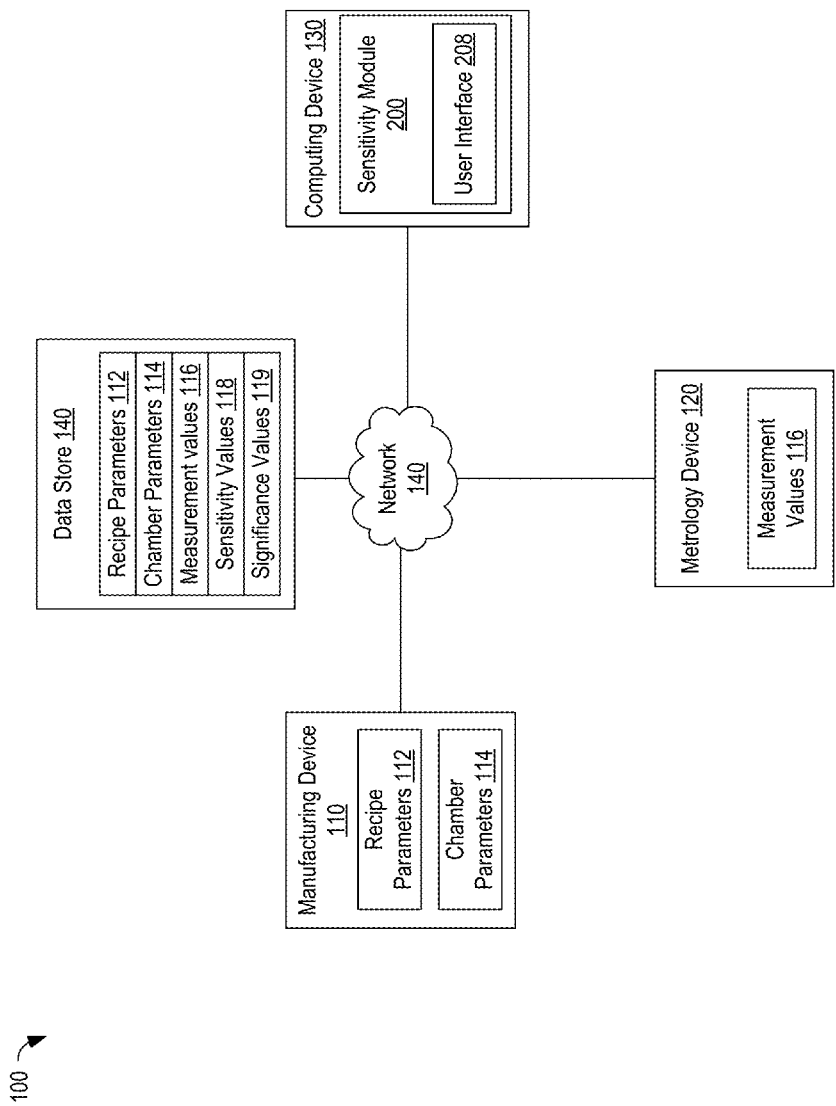
FIG. 1 illustrates an example architecture of a wafer manufacturing system, in accordance with an embodiment of the present invention.

FIG. 1 illustrates an example architecture of a wafer manufacturing system 100, in accordance with an embodiment of the present invention. In one embodiment, the wafer manufacturing system 100 may include a manufacturing device 110, metrology device 120, computing device 130, and network 140. The manufacturing device 110 may be a semiconductor wafer manufacturing device that includes one or more processing chambers. For example, the manufacturing device 110 may be an ion implanter, an etch reactor, a photolithography device, a deposition device (e.g., for performing chemical vapor deposition (CVD), physical vapor deposition (PVD), ion-assisted deposition (IAD), and so on), or other manufacturing device.

In one embodiment, the manufacturing device 110 is connected to metrology device 120 and computing device 130 via network 140. The network 140 may be a local area network (LAN), and may be part of an equipment automation layer that may additionally include routers, gateways, servers, data stores, and so on. The manufacturing device 110 may connect to the equipment automation layer (e.g., to the network 140) via a SEMI Equipment Communications Standard/Generic Equipment Model (SECS/GEM) interface, via an Ethernet interface, and/or via other interfaces. In one embodiment, the equipment automation layer enables process data (e.g., data collected by manufacturing device 110 during a process run) to be stored in a data store 140.

In other embodiments, manufacturing device 110 may connect directly to metrology device 120, data store 140 and/or computing device 130. In one embodiment, manufacturing device 110 may include recipe parameters 112 and chamber parameters 114.

In one embodiment, recipe parameters 112 may include all parameters that are associated with the manufacturing of semiconductor wafers. For example, recipe parameters 112 may include, but are certainly not limited to: chamber heater temperature, deposition pressure, pulse time, heater spacing, radio frequency (RF) power, and flow rate. Additionally, recipe parameters 112 may include values associated with each parameter, where the values affect how a given parameter is used throughout the wafer manufacturing process. For example, in a DOE with flow rate as a recipe parameter, flow rate may have a value of 75 sccm. The flow rate value affects how much oxygen, silane, ammonia, or other types of gas enter a chamber. In another example, a temperature recipe parameter may have a value of 800° C.

In one embodiment, chamber parameters 114 may include measured in-situ parameters that are associated with the manufacturing of a semiconductor wafer in a specific chamber of a manufacturing device 110. As an example, chamber parameters 114 may include, but are not limited to, various physical measurements of the chamber. Chamber parameters 114 may additionally include the location of a wafer inside the chamber.

In one embodiment, the manufacturing device 110 is programmed to execute process recipes associated with recipe parameters 112 that will cause the manufacturing device 110 to manufacture a semiconductor wafer. In one embodiment, manufacturing device 110 includes a programmable controller that can load, store and execute process recipes. The programmable controller may control recipe parameters 112 such as temperature settings, gas and/or vacuum settings, time settings, energy settings, etc. of manufacturing device 110. The programmable controller may include a main memory (e.g., read-only memory (ROM), flash memory, dynamic random access memory (DRAM), static random access memory (SRAM), etc.), and/or a secondary memory (e.g., a data storage device such as a disk drive). The main memory and/or secondary memory may store instructions for performing various types of manufacturing processes.

The programmable controller may also include a processing device coupled to the main memory and/or secondary memory (e.g., via a bus) to execute the instructions. The processing device may be a general-purpose processing device such as a microprocessor, central processing unit, or the like. The processing device may also be a special-purpose processing device such as an application specific integrated circuit (ASIC), a field programmable gate array (FPGA), a digital signal processor (DSP), network processor, or the like. In one embodiment, programmable controller is a programmable logic controller (PLC).

The wafer manufacturing system 100 may further include one or more metrology devices 120 connected to the network 140. In alternative embodiments, the wafer manufacturing system 100 may include more or fewer components. For example, the wafer manufacturing system 100 may include manually operated (e.g., off-line) manufacturing device 110 and metrology device 120 that are not connected to network 140.

In one embodiment, metrology devices 120 can perform wafer measurements, such as measuring wafer bow, resistivity, wrap, flatness, and thickness, resulting in measurement values 116. A metrology device 120 can be used for testing, but can also have other applications, such as monitoring environmental parameters and data on acoustics, vibrations, and temperature. A metrology device 120 can additionally perform other tasks in some embodiments, such as holding, joining, separating, soldering, etc. Examples of metrology devices include overlay metrology devices, optical critical dimension (CD) metrology devices, film thickness metrology devices, implant and anneal metrology devices, sheet resistance mapping metrology devices, and so on.

In one embodiment, metrology device 120 includes a programmable controller that can load, store and execute process recipes. The programmable controller may control measurement operations resulting in measurement values 116. The programmable controller may include a main memory (e.g., read-only memory (ROM), flash memory, dynamic random access memory (DRAM), static random access memory (SRAM), etc.), and/or a secondary memory (e.g., a data storage device such as a disk drive). The main memory and/or secondary memory may store instructions for performing point by point DOE analysis, as described herein.

The programmable controller may also include a processing device coupled to the main memory and/or secondary memory (e.g., via a bus) to execute the instructions. The processing device may be a general-purpose processing device such as a microprocessor, central processing unit, or the like. The processing device may also be a special-purpose processing device such as an application specific integrated circuit (ASIC), a field programmable gate array (FPGA), a digital signal processor (DSP), network processor, or the like. In one embodiment, programmable controller is a programmable logic controller (PLC).

The wafer manufacturing system 100 may further include a data store to store the recipe parameters 112, chamber parameters 114, measurement values 116, sensitivity values 118, significance values 119 and/or other information. Additionally, the wafer manufacturing system 100 may include one or more computing devices (e.g., computing device 130) connected to the network 140.

In one embodiment, computing device 130 includes a sensitivity module 200. Sensitivity module 200 of computing device 130 performs a least square fit analysis on recipe parameters 112 and measurement values 116 to determine sensitivity values 118 based on the recipe parameters 112 and measurement values 116. In one embodiment, a least square fit analysis is an approach in regression analysis to the approximate solution of overdetermined systems, i.e., sets of equations in which there are more equations than unknowns. In one embodiment, "least squares" means that the overall solution minimizes the sum of the squares of the errors made in the results of every single equation. In another embodiment, Sensitivity module 200 of computing device 130 may calculate significance values 119 (e.g. t-ratios, discussed in detail below) based on sensitivity values 118.

Sensitivity module 200 may determine recipe parameters 112 based on process recipes corresponding to multiple DOEs. The recipe parameters 112 may include recipe parameters 112 associated with various recipe permutations that have been used to process wafers in accordance with a DOE. Each set of recipe parameters 112 may correspond to a different process recipe (e.g., a different set of recipe parameters 112) and may be associated with a recipe identifier (ID).

Sensitivity module 200 additionally obtains measurement values 116 associated with the various recipe permutations. Each set of measurement values may have been obtained based on measurement by measurement device 120 of a wafer processed using a particular process recipe. Data store 140 may store information indicating that the wafer was processed using the particular recipe, and this information may be used to correlate the measurement values 116 for that wafer to the recipe parameters 112 of the process recipe used to process that wafer.

Sensitivity module 200 of computing device 130 may determine sensitivity values based on the least square fit analysis. In one embodiment, linear regression beta coefficients (hereafter referred to as beta coefficients), the output of the least square fit analysis, capture the sensitivity information as beta coefficients. In one embodiment, a t-ratio is calculated for each parameter to estimate a significance of the parameter. The t-ratio is used to show spatially where a wafer is sensitive to a particular input factor, and may indicate an amount of error associated with the sensitivity values for particular recipe parameters. In one embodiment, the t-ratio is a ratio of the departure of an estimated parameter from its notional value and its standard error.

In one embodiment, computing device 130 includes a user interface 208. In an example embodiment, user interface 208 of computing device 130 can be used to display the sensitivity values 118 stored in data store 140. In one embodiment, user interface 208 displays the sensitivity values 118 in the form of a two-dimensional (2D) contour map (discussed with respect to FIG. 6). In another embodiment, user interface 208 displays the sensitivity values 118 in the form of a three-dimensional (3D) contour map (see discussion related to FIG. 7). In various embodiments, user interface 208 allows a user to determine whether the sensitivity values 118 are displayed in 2D or 3D form. In other embodiments, other display forms may be used besides contour maps, for example, bar graphs. User interface 208 also allows a user to select the recipe parameter 112 associated with the sensitivity values 118 that should be displayed.

In one embodiment, the computing device 130 may retrieve sets of recipe parameters 112 associated with multiple process recipes from data store 140. Computing device 130 may additionally retrieve multiple sets of measurement values 116 of wafers that have been processed using the multiple process recipes. Computing device 130 may then correlate each set of measurement values 116 to one of the sets of recipe parameters 112. The correlation may be performed based on stored information identifying which process recipes were used on each of the measured wafers. Sensitivity module 200 may then perform point by point analysis of the recipe parameters 112 and measurement values 116 to determine point-by-point sensitivity values for each of the recipe parameters.

In one example illustration, manufacturing device 110 manufactures a wafer using a recipe that includes recipe parameters 112 and chamber parameters 114. The wafer is then transferred to metrology device 120 to be measured. In one embodiment, metrology device 120 measures the thickness of 49 locations (points) of the wafer. In another embodiment, 121 locations are measured, or another number of locations are measured. The manufacturing and measuring process is repeated with varying recipe 112 and chamber parameters 114 according to the constraints of a particular DOE. All of this data is then analyzed by sensitivity module 200 to determine the point by point sensitivities to each of the recipe parameters.

Figure 2A:
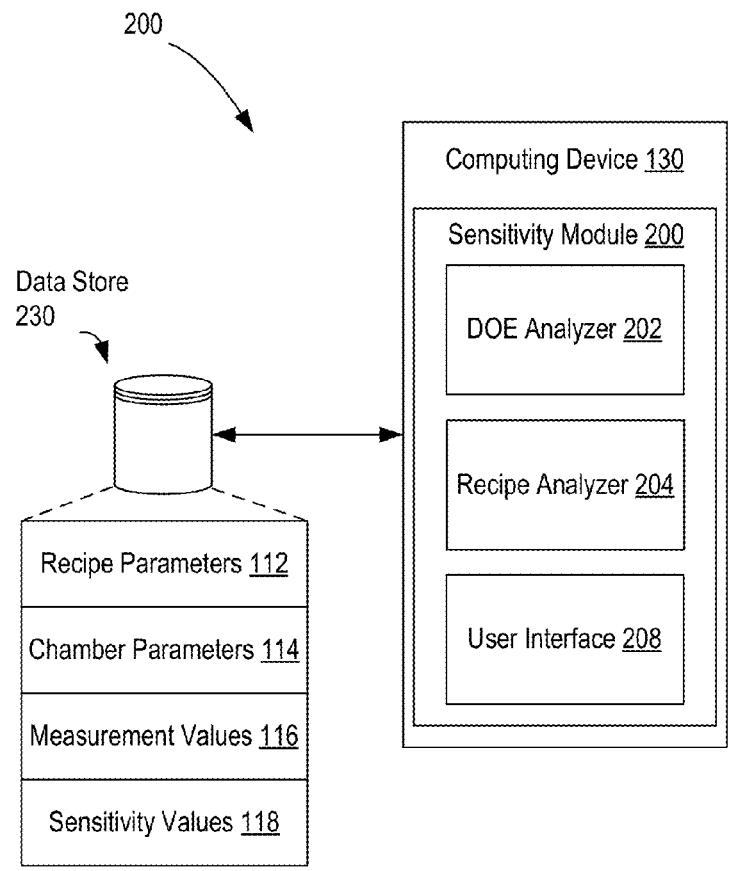
FIG. 2A is an example block diagram of a wafer analysis system, in accordance with an embodiment of the present invention.

FIG. 2A is an example block diagram of a wafer analysis system 200, in accordance with an embodiment of the present invention. In one embodiment, wafer analysis system 200 includes computing device 130 and data store 230. In one embodiment, computing device 130 includes sensitivity module 200. In various embodiments, sensitivity module 200 includes various sub-modules including DOE analyzer 202, recipe analyzer 204, and user interface 208. This arrangement of modules may be a logical separation, and in other embodiments, these modules or other components can be combined together or separated into further components.

In one embodiment, data store 230 stores recipe parameters 112, chamber parameters 114, and measurement values 116. In another embodiment, data store 230 additionally stores sensitivity values 118. Optionally, recipe parameters 112, chamber parameters 114, measurement values 116, and sensitivity values 118 can all be stored in separated data stores associated with manufacturing device 110. In one embodiment, data store 230 may include a lookup table, a relational database, a collection of flat files, or other data structure for storing information.

Data store 230 may include one or more mass storage devices which can include, for example, flash memory, magnetic or optical disks, or tape drives, read-only memory (ROM), random-access memory (RAM), erasable programmable memory (e.g., EPROM and EEPROM), flash memory, or any other type of storage medium.

In one embodiment, sensitivity module 200 maintains or has access to data store 230. Sensitivity module 200 can initiate a DOE analysis. As part of the DOE analysis, sensitivity module 200 may receive data from manufacturing device 110, metrology device 120, data store 230, and/or a computer application program. Using input from data store 230, manufacturing device 110 and/or metrology device, the various modules of sensitivity module 200 can perform point by point DOE analysis.

In one embodiment, DOE analyzer 202 and recipe analyzer 204 are used to perform a point by point DOE analysis using recipe parameters 112 and measurement values 116 located in data store 230. In one embodiment, DOE analyzer 202 receives recipe parameters 112 and associated measurement values 116. The recipe parameters 112 and measurement values 116 may be received directly from a manufacturing device and/or a metrology device. Alternatively, the recipe parameters 112, and measurement values 116 may be retrieved from data store 230. In some embodiments, chamber parameters 114 are also retrieved and used to perform the point by point analysis of the DOE data.

In one embodiment, DOE analyzer 202 receives parameters 112, 114, and/or measurement values 116, and performs a point by point DOE analysis on the DOE information. The DOE analysis may be performed automatically on completion of a DOE and/or responsive to user input. In one embodiment, point by point DOE analysis is performed by applying a least square fit analysis on the recipe parameters 112 and the measurement values 116 for each measured location 250 on the wafers in a particular DOE. The least square fit analysis is performed separately for each measurement value at each wafer location in embodiments. An output of the least square fit analysis is a separate least square fit model for each wafer location.

The objective of a least square fit analysis consists of adjusting the parameters of a model function to best fit a data set. A simple data set consists of n points (data pairs) $(x_i, y_i)$, i=1, ..., n, where $x_i$ is an independent variable and $y_i$ is a dependent variable whose value is found by observation. The model function may have the form $f(x,\beta)$, where m adjustable parameters are held in the vector $\beta$. The goal is to find the parameter values for the model which "best" fits the data. The least squares method finds its optimum when the sum, S, of squared residuals $$S = \sum_{i=1}^{n} r_i^2$$

is a minimum. A residual is defined as the difference between the actual value of the dependent variable and the value predicted by the model.

$$r_i = y_i - f(x_i, \beta).$$

An example of a model is that of the straight line in two dimensions. Denoting the intercept as $\beta_0$ and the slope as $\beta_1$, the model function is given by $f(x,\beta) = \beta_0 + \beta_1 x$.

Because the least square fit analysis is performed for each measurement value 116 associated with a location 250, a least square fit model is determined individually for each measured location 250. In other embodiments, various other approaches in regression analysis may be used instead of a least squares analysis.

In one embodiment, when a least square fit model has been created for individual wafer locations 250, DOE analyzer 202 calculates sensitivity values 118 for locations 250 based on the least square fit model. In one embodiment, the sensitivity values are in the form of beta coefficients. For example, a single-input model may be represented by $y = \beta_0 + \beta_1 x$. This formula may be considered the equation of a line where $\beta_0$ is the intercept and $\beta_1$ is the slope. In one embodiment, the slope of the equation, which is the beta coefficient, represents the sensitivity, which indicates how much a change in x affects the y value. Accordingly, the beta coefficient for a recipe parameter indicates how much that recipe parameter affects a particular measurable property of a manufactured wafer or process (e.g., a film thickness, an etch rate, etc.). This equation may be generalized to support many inputs, x. In general, (in matrix notation) $Y = \beta, X$.

In one embodiment, significance values 119, based on beta coefficients, represent the significance of the sensitivity values 118. In one embodiment, a t-ratio (also called t-statistic) is a significance value in the form of a ratio of the departure of an estimated parameter from its notional value and its standard error. In one embodiment, a t-ratio is calculated by letting $\hat{\beta}$ be an estimator of parameter $\beta$ in some statistical model (e.g. the least square fit analysis, above). A t-ratio for this parameter a quantity of the form $$t_{\hat{\beta}} = \frac{\hat{\beta} - \beta_0}{s.e.(\hat{\beta})}$$

where $\beta_0$ is a non-random, known constant, and $s.e.(\hat{\beta})$ is the standard error of the estimator $\hat{\beta}$. In one embodiment, the t-ratio is a signal to noise figure for $\beta$; the bigger it is the more the beta coefficient may be trusted. In one embodiment, a t-ratio threshold may be '2.' In various embodiments, t-ratio values less than the threshold indicate that there is a high error associated with the Beta value and thus it may not be trust worthy. In other embodiments a t-ratio of less than the threshold may be indicative of either a bad experiment or an input (e.g., a recipe parameter) that does not have a significant effect on the output (e.g., film thickness). In other embodiments, various other forms of signal to noise ratios (significance values 119), such as a z-score, may be used.

In one embodiment, separate sensitivity values 118 are determined for each recipe parameter 112. For example, a wafer might have separate sensitivity values 118 for each of any number of recipe parameters 112. In example, the film thickness on a wafer may have a first sensitivity to a gas flow rate, a second sensitivity to a chamber pressure, a third sensitivity to a temperature, and a fourth sensitivity to a process time. Separate sensitivities may be calculated for each location 250 on a wafer. For example, a first location on a wafer may have a different sensitivity to a gas flow rate than a second location on the wafer. The result is that each location 250 on a wafer has multiple sensitivity values 118; one each for any number of recipe parameters 112.

In one embodiment, DOE analyzer 202 can determine recipe parameters 112 that have the highest sensitivity. For example, DOE analyzer 202 may rank the recipe parameters based on sensitivity (e.g., based on beta coefficients). In one embodiment, DOE analyzer 202 may determine recipe parameters 112 that are above a threshold sensitivity value (e.g., for which a computed beta coefficient that is greater than a threshold value). By performing multiple DOE tests and comparing calculated sensitivity values (e.g., linear regression Beta coefficients), DOE analyzer may compile a list ranking recipe parameters 112 according to corresponding sensitivity values 118. Additionally, significance values 119 may be calculated, based on the sensitivity values 118, to determine the significance of the associated recipe parameters. A second list may be created that ranks recipe parameters 112 according to their significance (e.g., t-ratios). Alternatively, the t-ratios for recipe parameters may be added to the first list. When the second list is compiled with ranked t-ratios, any recipe parameters 112 with associated t-ratios that fall above a threshold value may be flagged to a user. The threshold value may be provided by a user via user interface 208 or may be set to a default value. In one embodiment, the threshold value corresponds to a t-ratio of 2. Alternatively, other threshold values (e.g., corresponding to t-values of 1.5, 2.5, etc.) may be used. In one embodiment, recipe parameters that have both a sensitivity value that is above a sensitivity threshold and a significance value above a significance threshold are flagged to a user. The recipe parameters that have a sensitivity value above the sensitivity threshold and a significance value above the significance threshold may be those recipe parameters that can be adjusted to control manufacturing results of a recipe.

In an example embodiment, user interface 208 of sensitivity module 200 can be used to display the sensitivity values 118 determined by DOE analyzer 202. In one embodiment, user interface 208 displays the sensitivity values 118 in the form of a two-dimensional (2D) contour map (discussed with respect to FIG. 6). In another embodiment, user interface 208 displays the sensitivity values 118 in the form of a three-dimensional (3D) contour map (see discussion related to FIG. 7). User interface 208 may also display significance values 119 of recipe parameters. For example, user interface 208 may display 2D or 3D contour maps showing significance values 119 for one or more recipe parameters. In various embodiments, user interface 208 allows a user to determine whether the sensitivity values 118 and/or significance values 119 are displayed in 2D or 3D form. In other embodiments, other display forms may be used besides contour maps, for example, bar graphs. User interface 208 also allows a user to select the recipe parameter 112 associated with the sensitivity values 118 and/or significance values 119 that should be displayed.

In some embodiments it may be useful to perform recipe creation operations. For example, it is useful in some circumstances to be able to determine a wafer recipe based on a target wafer film thickness profile and prior calculated sensitivity values 118. In one embodiment, recipe analyzer 204 performs such operations. Recipe analyzer 204 receives as an input a target profile based on the thickness of a desired wafer. The target profile may include a target average thickness for the entire wafer, a target standard deviation, or other target values. By using the target profile as an input to a set of least square fit models determined by DOE analyzer 202 (e.g., models for each recipe parameter and each wafer location), recipe analyzer 204 can output specific recipe parameters 112 that, when combined, allow for the target profile to be manufactured. In one embodiment, recipe analyzer 204 stores the determined recipe parameters 112 as a new process recipe and/or passes the determined recipe parameters 112 to manufacturing device 110 for wafer fabrication.

In one example, a function $f(x,\beta)$ is represented by the equation $f(x,\beta)=\beta_0+\beta_1 x$. In this example, the desired target may be computed finding x, where x represents beta coefficients computed from the least square fit model. We can rewrite this in matrix notation as follows:

$$y=[\beta_0,\beta_1]\cdot[1,x]^\tau$$

where y represents the function $f(x,\beta)$. So in this case we may solve for x by rearranging the equation above as:

$$x = \frac{y - \beta_0}{\beta_1}$$

Or in matrix notation:

$$x=[\beta_1]^{-1}\cdot[y,\beta_0]$$

In one example, measurements are taken at three locations, yielding three equations (one for each location). Solving the three equations for x results in the same target (e.g. film thickness) at each location. Expressing this in matrix notation yields:

$$x = \begin{bmatrix} \beta_{0,1} \\ \beta_{1,1} \\ \beta_{2,1} \end{bmatrix}^{-1} \begin{bmatrix} y - \beta_{0,0} \\ y - \beta_{1,0} \\ y - \beta_{2,0} \end{bmatrix}$$

This generalizes to the following:

$$\begin{bmatrix} x_0 \\ \vdots \\ x_n \end{bmatrix} = \begin{bmatrix} \beta_{0,1} & \cdots & \beta_{0,n} \\ \vdots & \ddots & \vdots \\ \beta_{n,1} & \cdots & \beta_{m,n} \end{bmatrix}^{-1} \begin{bmatrix} y_0 - \beta_{0,0} \\ \vdots \\ y_m - \beta_{m,0} \end{bmatrix}$$

Where 'n' is the number of inputs to the DOE and 'm' is the number of locations measured.

In the case where the solution returns an x value that does not make sense to the process (for example it could return −20 T if x was a pressure reading), adding more locations helps by constraining the x values. In one embodiment, linear programming may be used with a constraints method to solve this set of equations. Alternatively, a search algorithm approach may be used if the problem is non-linear, where the x value(s) are constrained to a known operating window.

In additional embodiments, it may be useful to perform chamber matching operations between different chambers of the same manufacturing device and/or between chambers of different manufacturing devices. For example, it is useful in some circumstances to be able to modify recipe parameters 112 to get better uniformity across wafers manufactured in different chambers. In one embodiment, recipe analyzer 204 performs such operations. Recipe analyzer 204 receives as an input first recipe parameters 112 and first sensitivity values 118 associated with a process recipe performed on a source chamber and second recipe parameters 112 and second sensitivity values 118 associated with the process recipe performed on a target chamber. Such sensitivity values 118 could be the result of a point by point DOE analysis performed on the source chamber and on the target chamber by DOE analyzer 202. In another embodiment, recipe analyzer 204 may receive significance values 119.

Recipe analyzer 204 compares the sensitivity values 118 and/or significance values 119 from the source chamber against those of the target chamber to determine what modifications can be made to the target chamber's recipe parameters 112 so that the wafers produced by both the target chamber and the source chamber have the same thickness profiles. In one embodiment, recipe analyzer 204 modifies the recipe parameters 112 for the process recipe on the target chamber so that the wafers produced by the target chamber better match the wafers produced by the source chamber.

In one example, an assumption is made that the source and target chambers have similar sensitivity values at each location. It is also assumed that an original DOE or sensitivity study was performed using a desired target as a baseline. Recipe analyzer 204 takes the location readings on the target chambers, and uses the sensitivity values from the source chamber to estimate recipe offsets in the target chamber so as to minimize the difference between the target chamber output and source chamber output at each location.

In one embodiment, the same calculation as outlined above with respect to recipe matching may be used to perform chamber matching. Above, a set of inputs was returned that would achieve a desired output. In the present example, the output is provided (as the outputs at each location on the target chamber) and the inputs that provide this output are determined. An offset is calculated based on the difference between the current baseline recipe parameters 112 and the inputs or recipe parameters 112 returned by recipe analyzer 202. This offset determines how much to change the target chamber recipe parameters to cause wafers processed using the target chamber to match wafers processed by the source chamber. In one example, the offsets are calculated to minimize a difference between target and source film thickness at each location, thereby resulting in better matching between chambers.

In one embodiment, user interface 208 provides the means for the operations associated with the DOE analyzer 202 and recipe analyzer 204 to be carried out responsive to user interaction. In one embodiment, DOE analyzer 202 and recipe analyzer 204 send their outputs to manufacturing device 110 to be implemented automatically. In other embodiments, DOE analyzer 202 and recipe analyzer 204 send their outputs to user interface 208 to be viewed, interpreted, and acted upon by a user. In one embodiment, output is recipe and/or chamber parameters.

In various embodiments, user interface 208 allows a user to select different recipe and chamber parameters and view their corresponding sensitivity values across a wafer. User interface 208 can further receive user input to initiate DOE analysis. Additionally, user interface 208 may provide graphical outputs (e.g. contour maps, see FIGS. 6 and 7), and enable a user to interact with the graphical outputs. In one embodiment, user interface 208 allows a user to rotate, zoom in, highlight, and perform various other operations useful to analyze the sensitivity values.

Figure 2B:
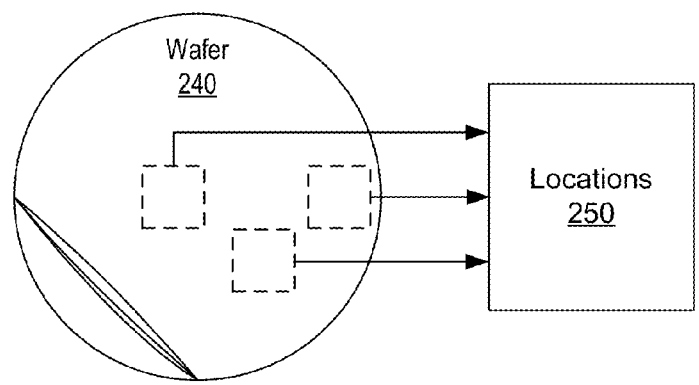
FIG. 2B is a block diagram of an example wafer and associated data points, in accordance with an embodiment of the present invention.

FIG. 2B is a block diagram of an example wafer and associated data points, in accordance with an embodiment of the present invention. As discussed above, in one embodiment a metrology device measures the thickness of wafer 240 at various locations 250 across the wafer 240. In various embodiments metrology device may take measurements from forty-nine locations 250, one hundred and twenty-one locations 250, or any other number of locations 250. There is no minimum or maximum number of locations 250 on which measurements may be recorded. In one embodiment, sensitivity values 118 and/or significance values 119 are determined for each recipe parameter 112, based on each location 250 at which wafer film thickness was recorded. In other embodiments sensitivity values 118 and/or significance values 119 are determined for only a subset of locations 250. In still other embodiments, sensitivity values 118 and/or significance values 119 are calculated for locations 250 that do have corresponding thickness measurements.

Figure 3:
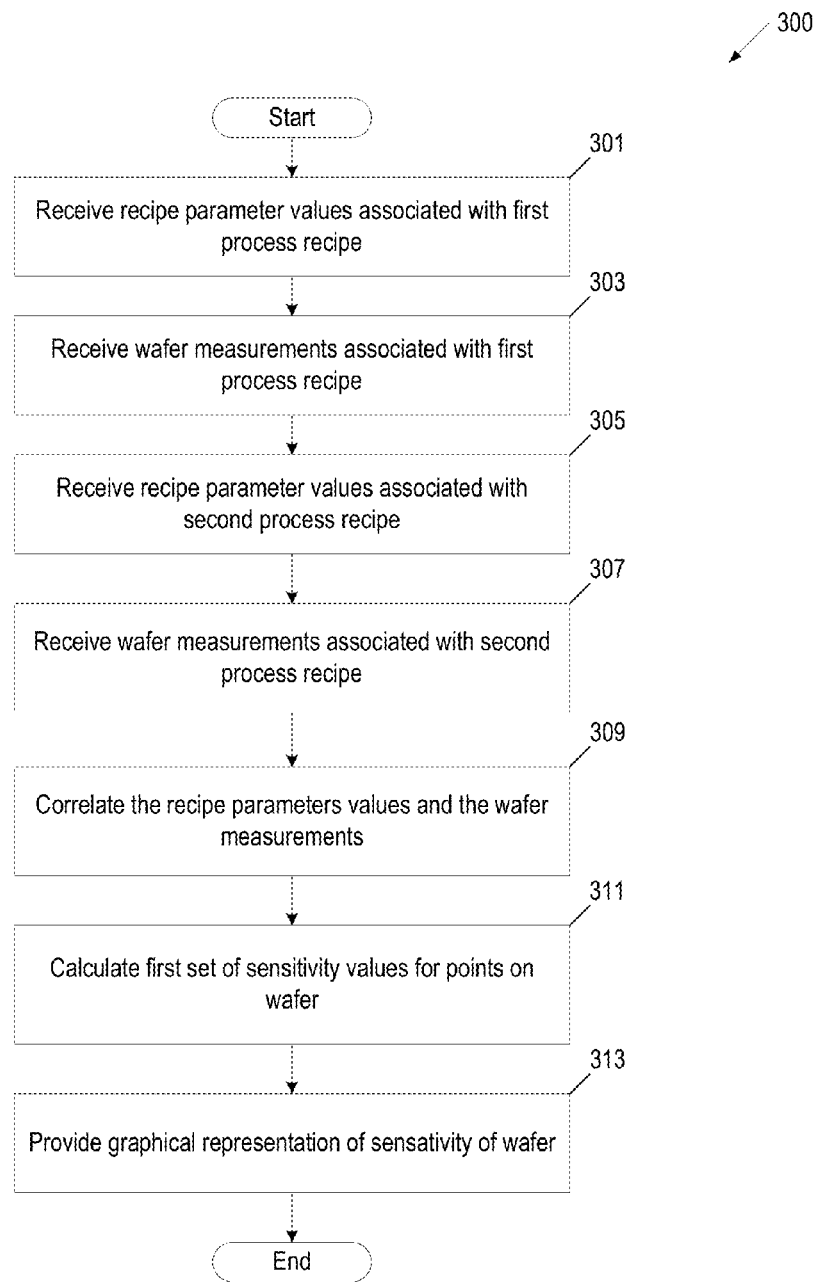
FIG. 3 is a flow diagram illustrating a method for point-by-point analysis of DOE data of a wafer with regards to a manufacturing process, in accordance with an embodiment of the present invention.

FIG. 3 is a flow diagram illustrating a method for point-by-point analysis of DOE data of a wafer with regards to a manufacturing process, in accordance with an embodiment of the present invention. The method 300 may be performed by processing logic that comprises hardware (e.g., circuitry, dedicated logic, programmable logic, microcode, etc.), software (e.g., instructions run on a processing device to perform hardware simulation), or a combination thereof. In one embodiment, DOE analyzer 202 of sensitivity module 200 executing on computing device 130 performs method 300.

Referring to FIG. 3, at block 301, processing logic receives recipe parameters 112 associated with a first process recipe. Recipe parameters 112 vary according to the particular DOE to be performed and/or according to a process for which the DOE is performed. For example, in a DOE designed to test two recipe parameters 112, temperature and pressure, each recipe parameter 112 may have an associated value for a particular recipe. In the present example, temperature may have a value of five and pressure a value of ten (each in their respective units). In one embodiment, recipe analyzer 204 may receive the recipe parameters 112 and associated values from manufacturing device 110.

In block 303, processing logic receives wafer measurement values 116 for a first wafer manufactured using the first set of recipe parameters 112 and associated values received in block 301. In one embodiment, wafer measurement values 116 are thickness measurements from a plurality of locations 250 on the wafer. For example, processing logic may receive forty-nine measurement values 114, each corresponding to a different location 250, for the wafer associated with the process recipe in block 301. In one embodiment recipe analyzer 204 may receive the measurement values 116 from metrology device 120.

At block 305, processing logic receives recipe parameters 112 associated with a second process recipe. For example, in the DOE described above, the second recipe may dictate that temperature have a value of fifteen and pressure have a value of twenty (each in their respective units). In one embodiment, recipe analyzer 204 may receive the recipe parameters 112 and associated values from manufacturing device 110.

At block 307, processing logic receives wafer measurement values 116 for a second wafer manufactured using the second set of recipe parameters 112 and associated values received in block 305. For example, processing logic may receive forty-nine measurement values 114, each corresponding to a different location 250, for the second wafer associated with the process recipe in block 305. In one embodiment recipe analyzer 204 may receive the measurement values 116 from metrology device 120.

At block 309, processing logic correlates the first recipe parameter values to the first measurement values and the second recipe parameter values to the second measurement values.

At block 311, processing logic calculates a first set of sensitivity values 118 and/or significance values 119, where each sensitivity value is associated with a location 250 on the wafer. In one embodiment, sensitivity values 118 are unique to a specific recipe parameter 112. In the present example, a wafer 240 where measurement values 116 were determined for forty-nine locations 250 has forty-nine sensitivity values 118 and/or significance values 119 for temperature and forty-nine sensitivity values 118 and/or significance values 119 for pressure, each corresponding to a location 250 on the wafer. Described a different way, two sensitivity values 118 and/or significance values 119, one for temperature and one for pressure, are associated with each of the forty-nine locations 250 on the wafer 240 in an example embodiment.

In one embodiment, sensitivity values 118 are calculated by the processing logic of the DOE analyzer 202 on computing device 130. In one embodiment, processing logic determines sensitivity values 118 by applying a least square fit analysis on the recipe parameters 112 and the measurement values 116 for each measured location 250 on the wafer 240. Because the least square fit analysis is performed for each measurement value 116 (associated with a location 250), a least square fit model may be determined individually for each measured location 250. It should also be noted that the least squared fit model created by processing logic at block 311 is particular to a location 250 on the wafer. Thus, a model is determined for each location 250 on wafer 240. Each model contains sensitivity information on the inputs to the model (e.g., on recipe parameters that affect the model).

In one embodiment, when least square fit models have been created for the wafer locations 250, DOE analyzer 202 calculates sensitivity values 118 for each recipe parameter 112 at the wafer locations 250 based on the least square fit models associated with those locations. In one embodiment, beta coefficients, the output of the least square fit analysis, capture the sensitivity information. In one embodiment, significance values 119 (e.g. t-ratio) are used to estimate the significance of the particular parameter. A t-ratio is used to show spatially where a wafer is most sensitive to a particular input factor. In one embodiment, the t-ratio is a ratio of the departure of an estimated parameter from its notional value and its standard error. In other embodiments, various other forms of signal to noise ratios (significance values), such as a z-score, may be used.

At block 313, processing logic displays a graphical representation of the sensitivity values 118 and/or significance values 119 determined at block 311 on a graphical interface. In one embodiment the graphical interface is user interface 208 of computing device 130. In one embodiment, user interface 208 displays the sensitivity values 118 and/or significance values 119 in the form of a two-dimensional (2D) contour map (discussed with respect to FIG. 6). In another embodiment, user interface 208 displays the sensitivity values 118 and/or significance values 119 in the form of a three-dimensional (3D) contour map (see discussion related to FIG. 7). In various embodiments, user interface 208 allows a user to determine whether the sensitivity values 118 and/or significance values 119 are displayed in 2D or 3D form. In other embodiments, other display forms may be used besides contour maps, for example, bar graphs. User interface 208 also allows a user to select the recipe parameter 112 associated with the sensitivity values 118 and/or significance values 119 that should be displayed.

Figure 4:
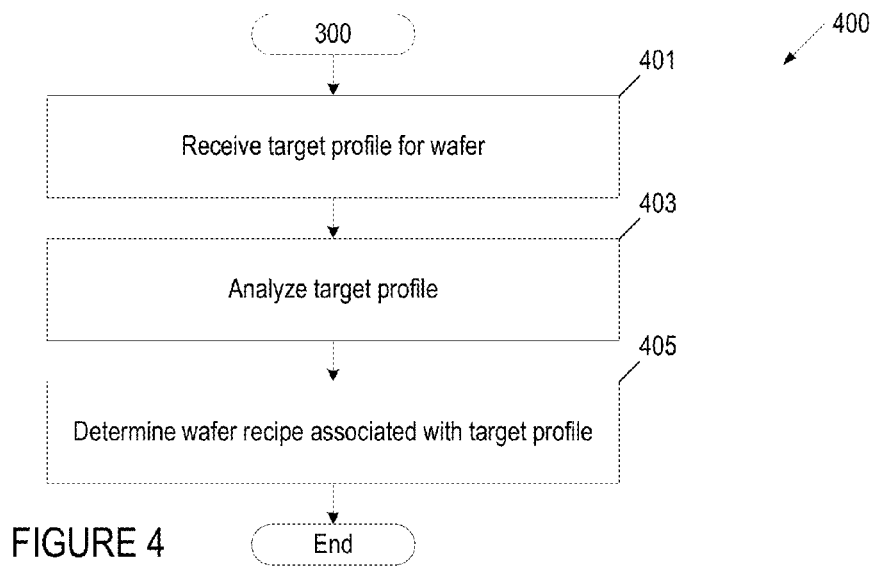
FIG. 4 is a flow diagram illustrating a method for determining a wafer recipe associated with a target profile, in accordance with an embodiment of the present invention.

FIG. 4 is a flow diagram illustrating a method 400 for determining a wafer recipe associated with a target profile, in accordance with an embodiment of the present invention. The method 400 may be performed by processing logic that comprises hardware (e.g., circuitry, dedicated logic, programmable logic, microcode, etc.), software (e.g., instructions run on a processing device to perform hardware simulation), or a combination thereof. Method 400 can perform point by point DOE analysis with a specific focus on determining a wafer recipe associated with a target profile. In one embodiment, the operations performed in method 400 may be performed after the operations in method 300. In one embodiment, recipe analyzer 204 of sensitivity module 200 in computing device 130 may perform method 400.

In some embodiments it may be useful to perform recipe creation operations. For example, it is useful in some circumstances to be able to determine a wafer recipe based on a target wafer film thickness profile and prior calculated sensitivity values 118.

Referring to FIG. 4, at block 401, processing logic receives as an input a target profile of a desired wafer. In one embodiment, the target profile is based on a desired thickness profile of the wafer. In another embodiment, the target profile may be based on other factors, such as etch rate, sheet resistance, and film composition. For example, the processing logic of the present disclosure may be used to find target values for recipe parameters to increase uniformity of the etch rate. In another example, processing logic may be used to find inputs (recipe parameters) to provide a target 'sheet resistance' across a wafer. In a further example, processing logic may be used to find inputs (recipe parameters) to ensure a ratio of Ti to Al is consistent across a wafer.

At blocks 403 and 405, processing logic analyzes the target profile in view of past sensitivity values 118 and/or significance values 119 and determines a wafer recipe that when used, will result in a wafer profile that matches or nearly matches the target profile. By using the target profile as an input to a least square fit model determined, for example, in method 300, processing logic at block 405 can output specific recipe parameters 112 that, when combined, allow for the target profile to be manufactured. In one embodiment, a recipe analyzer passes the determined recipe parameters 112 to manufacturing device 110 for wafer fabrication. Take, for example, a target profile that represents an evenly distributed wafer film thickness across a wafer. Processing logic uses the target profile as input to a sensitivity model previously determined (e.g. in method 300), to determine a specific recipe that will result in the desired target profile.

Figure 5:
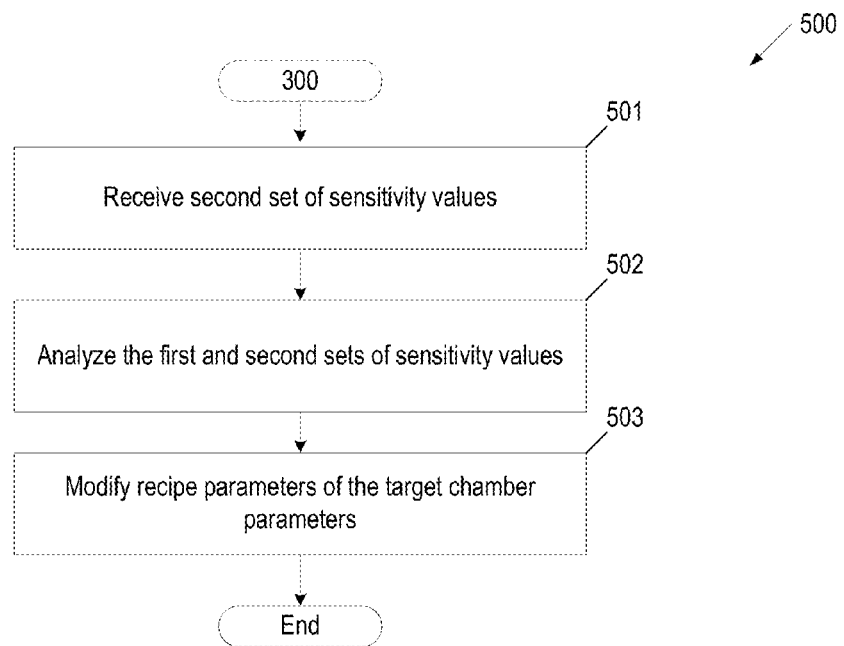
FIG. 5 is a flow diagram illustrating a method for determining target chamber parameters associated with source chamber parameters, in accordance with an embodiment of the present invention.

FIG. 5 is a flow diagram illustrating a method 500 for determining target chamber parameters associated with source chamber parameters, in accordance with an embodiment of the present invention. The method 500 may be performed by processing logic that comprises hardware (e.g., circuitry, dedicated logic, programmable logic, microcode, etc.), software (e.g., instructions run on a processing device to perform hardware simulation), or a combination thereof. Method 500 can perform point by point DOE analysis with a specific focus on chamber matching. In one embodiment, the operations performed in method 500 follow the operations performed in method 300. In one embodiment, recipe analyzer 204 of sensitivity module 200 may perform method 500.

In various embodiments, it may be useful to perform chamber matching operations. For example, it is useful in some circumstances to be able to modify recipe parameters 112 to get better profile consistency across wafers manufactured on different manufacturing devices. Referring to FIG. 5, at block 501, processing logic receives a second set of sensitivity values 118 and/or significance values 119. In one embodiment, the first set of sensitivity values 118 and/or significance values 119 was determined at block 311 of method 300. In one embodiment, the first set of sensitivity values 118 and/or significance values 119 corresponds to the source chamber and the second set of sensitivity values 118 and/or significance values 119 corresponds to the target chamber.

At block 502, processing logic analyzes the first and second set of sensitivity values 118 and/or significance values 119 and the first and second set of chamber parameters. In one embodiment, recipe analyzer 204 compares the sensitivity values 118 and/or significance values 119 from the source chamber against those of the target chamber to determine what modifications can be made to the target chamber's recipe parameters 112 so that the wafers produced by both the target chamber and the source chamber have similar thickness profiles. In one embodiment, processing logic may determine that a modification to recipe parameters 112 used by the target chamber can be modified to achieve better wafer uniformity between wafers produces by the source and target chambers.

At block 503 recipe parameters 112 associated with the target chamber are modified based on the analysis at block 502. In one embodiment, processing logic of sensitivity module 200 sends the modified recipe parameters 112 to manufacturing device 110 via network 140. In other embodiments, parameters recipe 112 are stored locally to computing device 130 in data store 230.

Figure 6:
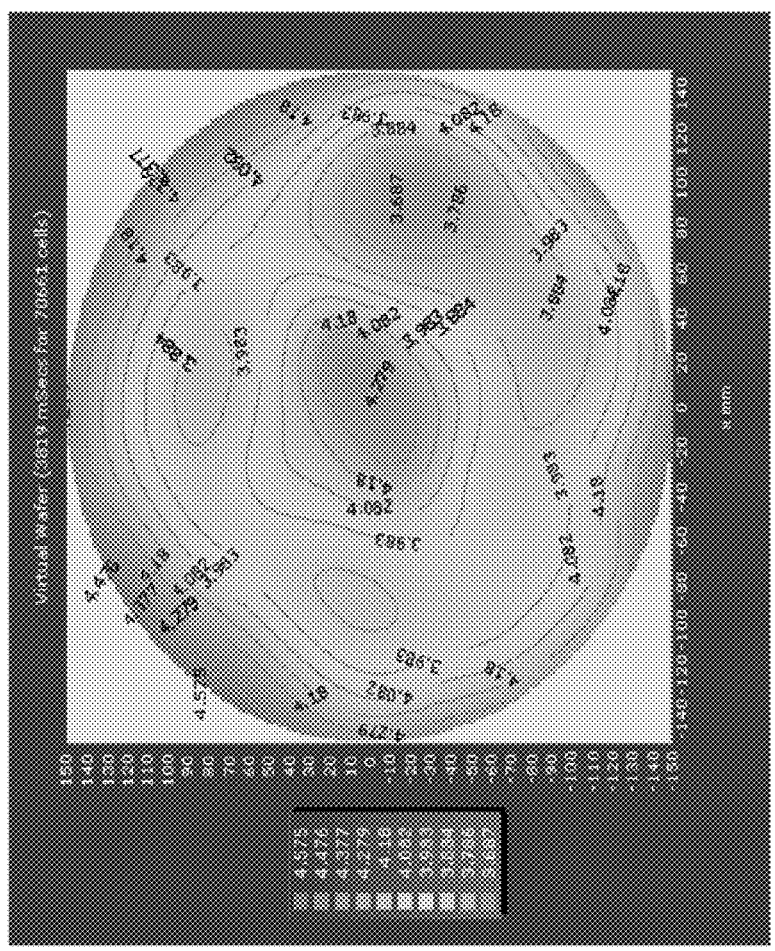
FIG. 6 is an example schematic representation of a 2-dimensional contour map, in accordance with an embodiment of the present invention.

FIG. 6 is an example schematic representation of a 2-dimensional (2D) contour map 600, in accordance with an embodiment of the present invention. In one embodiment, sensitivity values 118 and/or significance values 119 determined by the systems and methods of this disclosure are presented in a 2-dimensional contour map, as shown in FIG. 6. In one embodiment, the 2D contour map is overlaid on a depiction of the wafer it represents. In one embodiment, processing logic of sensitivity module 200 renders and displays a 2D contour map based on a single recipe parameter 112. A user may select which recipe parameter to represent in a 2D contour map of sensitivity values 118 and/or significance values 119. In other embodiments, more than one recipe parameter 112 can be represented by a single 2D contour map. For example, sensitivity values 118 and/or significance values 119 for a first recipe parameter may be shown using contour lines having a first line style, and sensitivity values 118 and/or significance values 119 for a second recipe parameter may be shown using contour lines having a second line style.

In the 2D contour map, lines are drawn that represent a particular sensitivity to a recipe parameter. The lines may include a numerical representation of the sensitivity (e.g., in the form of beta coefficients, as shown). In another embodiment, lines may include a numerical representation of the significance of recipe parameters (e.g. t-ratios). In one embodiment, the 2D contour map additionally uses a variety of colors and shades to display contrast between ranges in sensitivity values 118 and/or significance values 119. For example, the 2D contour map may use a range of colors, from red to green to blue, to indicate varying levels of sensitivity and/or significance. In one embodiment, areas with the highest sensitivity or significance may be represented by various shades of red and areas with the lowest sensitivity may be represented by various shades of blue. In other embodiments, sensitivity values 118 and/or significance values 119 are displayed directly on the 2D contour map. In various embodiments, sensitivity values 118 and/or significance values 119 are overlaid on the 2D contour map on the locations 250 with which they are correlated. In one embodiment, the 2D contour map can be rotated and skewed, to get a better view of various sensitivity values. Furthermore, an illustrated key may be provided with the 2D contour map. The key can display various sensitivity values 118 and/or significance values 119 and corresponding color representations.

Figure 7:
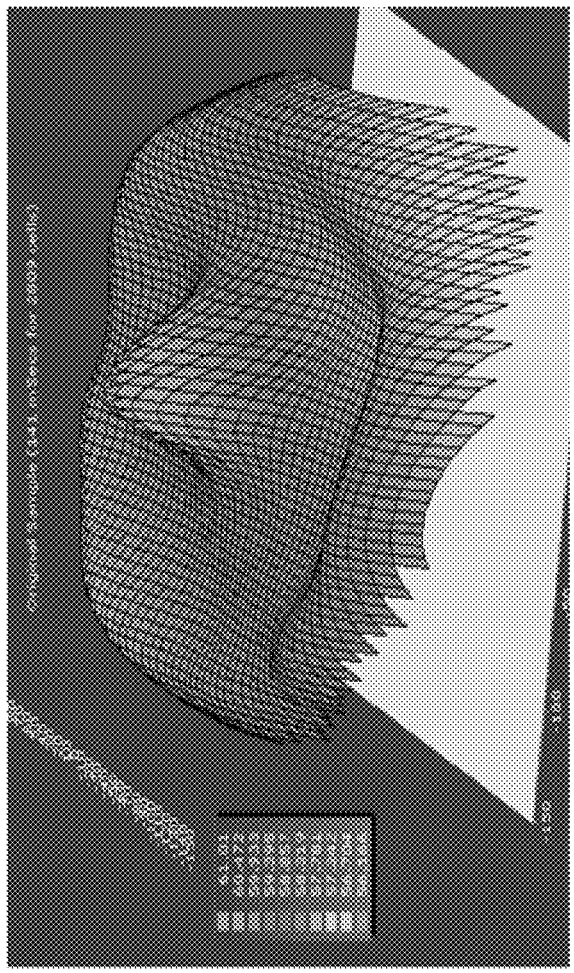
FIG. 7 is an example schematic representation of a 3-dimensional contour map, in accordance with an embodiment of the present invention.

FIG. 7 is an example schematic representation of a 3-dimensional (3D) contour map, in accordance with an embodiment of the present invention. In one embodiment, sensitivity values 118 and/or significance values 119 determined by the systems and methods of this disclosure are presented in a 3-dimensional contour map, as shown in FIG. 7. In one embodiment, the 3D contour map is overlaid on a depiction of the wafer it represents. In one embodiment, processing logic of sensitivity module 200 renders and displays a 3D contour map based on a single recipe parameter 112. In other embodiments, more than one recipe parameter 112 can be represented by a single 3D contour map.

In one embodiment, the 3D contour map shows the sensitivity of a wafer parameter (e.g., film thickness) to a recipe parameter (e.g., temperature, pressure, etc.). In one embodiment, the height of the contour is based on the sensitivity value, where height directly correlates to sensitivity. In another embodiment, the height of the contour is based on significance values 119 (e.g. t-ratios). In the illustrated example, a center of the wafer is more sensitive to a particular recipe parameter than a remainder of the wafer. Additionally, the outer perimeter of the wafer is more sensitive to the recipe parameter than much of a remainder of the wafer. As stated previously, traditional systems include a single averaged sensitivity to a particular recipe parameter that is averaged over the entire wafer. By averaging across the wafer, information can be lost. For instance, a single, averaged sensitivity across a wafer does not accurately represent particular deformities that are preferably to be accounted for when engineering and manufacturing a wafer. It is useful to be aware of such deformities in an end-product. Additionally, the discovery of particular deformities greatly improves the accuracy of wafer design and manufacturing. In contrast, embodiments described herein provide a point-by-point analysis of sensitivity to recipe parameters across a wafer.

In one embodiment, the 3D contour map uses a variety of colors and shades to display contrast between ranges in sensitivity values 118 and/or significance values 119. In other embodiments, sensitivity values 118 and/or significance values 119 are displayed directly on the 3D contour map. In various embodiments, sensitivity values 118 and/or significance values 119 are overlaid on the 3D contour map on the locations 250 with which they are correlated. In one embodiment, the 3D contour map can be rotated and skewed, to get a better view of various sensitivity values. Furthermore, an illustrated key may be provided with the 3D contour map. The key can display various sensitivity values and corresponding color representations.

Figure 8:
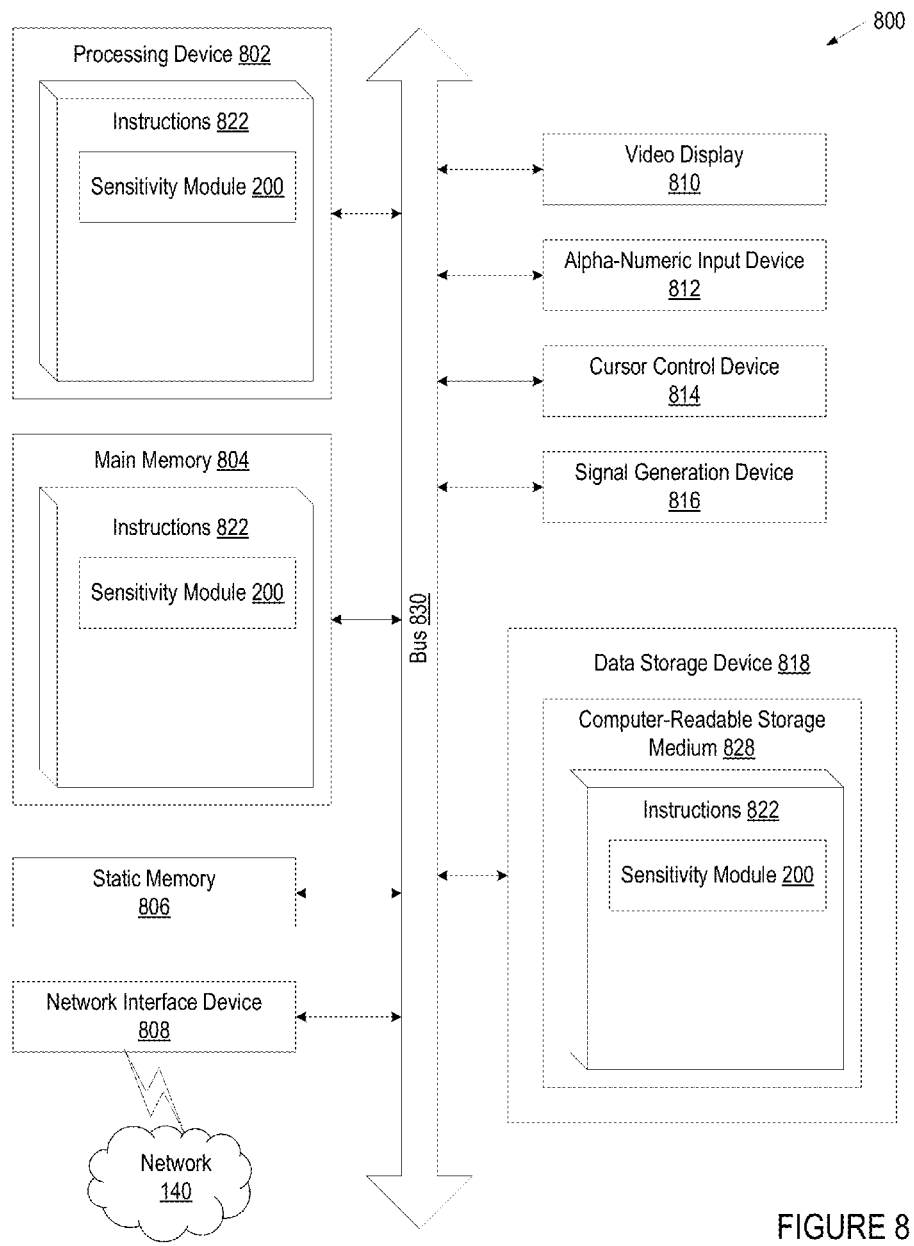
FIG. 8 is a block diagram of an example computer system that may perform one or more of the operations described herein.

FIG. 8 illustrates a diagram of a machine in the example form of a computer system 800 within which a set of instructions, for causing the machine to perform any one or more of the methodologies discussed herein, may be executed. In alternative embodiments, the machine may be connected (e.g., networked) to other machines in a LAN, an intranet, an extranet, or the Internet. The machine may operate in the capacity of a server or a client machine in client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device (processor) 802, a main memory 804 (e.g., read-only memory (ROM), flash memory, dynamic random access memory (DRAM) such as synchronous DRAM (SDRAM), double data rate (DDR SDRAM), or DRAM (RDRAM), etc.), a static memory 806 (e.g., flash memory, static random access memory (SRAM), etc.), and a data storage device 818, which communicate with each other via a bus 830.

Processor 802 represents one or more general-purpose processing devices such as a microprocessor, central processing unit, or the like. More particularly, the processor 802 may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processor 802 may also be one or more special-purpose processing devices such as an application specific integrated circuit (ASIC), a field programmable gate array (FPGA), a digital signal processor (DSP), network processor, or the like. The processor 802 is configured to execute instructions 822 for performing the operations and steps discussed herein.

The computer system 800 may further include a network interface device 808. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), and a signal generation device 816 (e.g., a speaker).

The data storage device 818 may include a computer-readable storage medium 824 on which is stored one or more sets of instructions 822 (e.g., software) embodying any one or more of the methodologies or functions described herein, including sensitivity module 200 as shown in FIG. 8. The instructions 822 may also reside, completely or at least partially, within the main memory 804 and/or within the processor 802 during execution thereof by the computer system 800, the main memory 804 and the processor 802 also constituting computer-readable storage media. The instructions 822 may further be transmitted or received over a network 140 via the network interface device 808.

In one embodiment, the instructions 822 include instructions for integration of point by point DOE analysis and/or a software library containing methods that call a sensitivity module 200 including instructions for point by point DOE analysis. While the computer-readable storage medium 824 (machine-readable storage medium) is shown in an example embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing, encoding or carrying a set of instructions for execution by the machine and that cause the machine to perform any one or more of the methodologies of the present invention. The term "computer-readable storage medium" shall accordingly be taken to include, but not be limited to, solid-state memories, optical media, and magnetic media.

In the foregoing description, numerous details are set forth. It will be apparent, however, to one of ordinary skill in the art having the benefit of this disclosure, that the present invention may be practiced without these specific details. In some instances, well-known structures and devices are shown in block diagram form, rather than in detail, in order to avoid obscuring the present invention.

Some portions of the detailed description have been presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "receiving", "correlating", "calculating", "providing", "performing," "analyzing," "modifying," or the like, refer to the actions and processes of a computer system, or similar electronic computing device, that manipulates and transforms data represented as physical (e.g., electronic) quantities within the computer system's registers and memories into other data similarly represented as physical quantities within the computer system memories or registers or other such information storage, transmission or display devices.

The present invention also relates to an apparatus for performing the operations herein. This apparatus may be constructed for the intended purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method, comprising:
   receiving first values for a plurality of recipe parameters associated with a first process recipe;

receiving a first plurality of measurements of a plurality of locations on a first wafer processed using the first process recipe;

receiving second values for the plurality of recipe parameters associated with a second process recipe;

receiving a second plurality of measurements of the plurality of locations on a second wafer processed using the second process recipe;

correlating, by a processing device, the first values for the plurality of recipe parameters to the first plurality of measurements and the second values for the plurality of recipe parameters to the second plurality of measurements;

calculating, by the processing device, a first plurality of sensitivity values using the first values for the plurality of recipe parameters, the second values for the plurality of recipe parameters, the first plurality of measurements, and the second plurality of measurements, each of the first plurality of sensitivity values corresponding to one of the plurality of locations and representing a sensitivity to one of the plurality of recipe parameters; and providing, by the processing device, a graphical representation of a wafer that shows at least a subset of the first plurality of sensitivity values for the plurality of locations, wherein the graphical representation of the wafer is provided for subsequent analysis and manufacturing of wafers.

2. The method of claim 1, wherein calculating the first plurality of sensitivity values comprises: performing a least square fit analysis based on the first values for the plurality of recipe parameters, the second values for the plurality of recipe parameters, the first plurality of measurements, and the second plurality of measurements.

3. The method of claim 1, wherein the graphical representation is a three-dimensional contour map, and wherein elevation in the three-dimensional contour map represents sensitivity to one of the plurality of recipe parameters.

4. The method of claim 1, wherein the graphical representation is a two-dimensional contour map, wherein the two-dimensional contour map comprises contour lines that represent sensitivity values.

5. The method of claim 1, further comprising:
receiving instructions identifying a recipe parameter of the plurality of recipe parameters; and
providing an updated graphical representation that shows a second subset of the first plurality of sensitivity values associated with the recipe parameter.

6. The method of claim 1, further comprising:
receiving a target profile for a third wafer, wherein the target profile is based on target thickness of the third wafer;
analyzing the target profile based on the first plurality of sensitivity values; and
determining, based on the analyzing of the target profile based on the first plurality of sensitivity values, a new process recipe associated with the target profile.

7. The method of claim 1, further comprising:
receiving a second plurality of sensitivity values, wherein the second plurality of sensitivity values is associated with a target chamber;
performing a first analysis of the first plurality of sensitivity values and the second plurality of sensitivity values; and
modifying, based on the first analysis, the second values for the plurality of recipe parameters, wherein the second values for the plurality of recipe parameters are associated with the target chamber.

8. A system comprising:
a memory to store a plurality of recipe parameters, recipe values, and measurements; and
a processing device, operatively coupled to the memory, the processing device to:
receive first values for the plurality of recipe parameters associated with a first process recipe;
receive a first plurality of measurements of a plurality of locations on a first wafer processed using the first process recipe;
receive second values for the plurality of recipe parameters associated with a second process recipe;
receive a second plurality of measurements of the plurality of locations on a second wafer processed using the second process recipe;
correlate the first values for the plurality of recipe parameters to the first plurality of measurements and the second values for the plurality of recipe parameters to the second plurality of measurements;
calculate a first plurality of sensitivity values using the first values for the plurality of recipe parameters, the second values for the plurality of recipe parameters, the first plurality of measurements, and the second plurality of measurements, each of the first plurality of sensitivity values corresponding to one of the plurality of locations and representing a sensitivity to one of the plurality of recipe parameters; and
provide a graphical representation of a wafer that shows at least a subset of the first plurality of sensitivity values for the plurality of locations, wherein the graphical representation of the wafer is provided for subsequent analysis and manufacturing of wafers.

9. The system of claim 8, wherein to calculate the first plurality of sensitivity values the processing device is further to: perform a least square fit analysis based on the first values for the plurality of recipe parameters, the second values for the plurality of recipe parameters, the first plurality of measurements, and the second plurality of measurements.

10. The system of claim 8, wherein the graphical representation is a three-dimensional contour map, and wherein elevation in the three-dimensional contour map represents sensitivity to one of the plurality of recipe parameters.

11. The system of claim 8, wherein the graphical representation is a two-dimensional contour map, wherein the two-dimensional contour map comprises contour lines that represent sensitivity values.

12. The system of claim 9, wherein the processing device is further to:
calculate a plurality of significance values based on the first plurality of sensitivity values, wherein each of the plurality significance values corresponds to one of each of the plurality of recipe parameters; and
determine a list of the plurality of recipe parameters, wherein each of the plurality of recipe parameters are ordered in the list based on their corresponding significance values.

13. The system of claim 8, wherein the processing device is further to:
receive a target profile for a third wafer, wherein the target profile is based on a target thickness of the third wafer;
analyze the target profile based on the first plurality of sensitivity values; and determine, based on analyzing of the target profile based on the first plurality of sensitivity values, a new process recipe associated with the target profile.

14. The system of claim 8, wherein the processing device is further to:
receive a second plurality of sensitivity values, wherein the second plurality of sensitivity values is associated with a target chamber;
perform a first analysis of the first plurality of sensitivity values and the second plurality of sensitivity values; and
modify, based on the first analysis, the second values for the plurality of recipe parameters, wherein the second values for the plurality of recipe parameters are associated with the target chamber.

15. A non-transitory machine-readable storage medium including instructions that, when accessed by a processing device, cause the processing device to:
receive first values for a plurality of recipe parameters associated with a first process recipe;
receive a first plurality of measurements of a plurality of locations on a first wafer processed using the first process recipe;
receive second values for the plurality of recipe parameters associated with a second process recipe;
receive a second plurality of measurements of the plurality of locations on a second wafer processed using the second process recipe;
correlate the first values for the plurality of recipe parameters to the first plurality of measurements and the second values for the plurality of recipe parameters to the second plurality of measurements;
calculate a first plurality of sensitivity values using the first values for the plurality of recipe parameters, the second values for the plurality of recipe parameters, the first plurality of measurements, and the second plurality of measurements, each of the first plurality of sensitivity values corresponding to one of the plurality of locations and representing a sensitivity to one of the plurality of recipe parameters; and
provide a graphical representation of a wafer that shows at least a subset of the first plurality of sensitivity values for the plurality of locations, wherein the graphical representation of the wafer is provided for subsequent analysis and manufacturing of wafers.

16. The non-transitory machine-readable storage medium of claim 15, wherein to calculate the first plurality of sensitivity values the processing device is further to: perform a least square fit analysis based on the first values for the plurality of recipe parameters, the second values for the plurality of recipe parameters, the first plurality of measurements, and the second plurality of measurements.

17. The non-transitory machine-readable storage medium of claim 15, wherein the graphical representation is a three-dimensional contour map, and wherein elevation in the three-dimensional contour map represents sensitivity to one of the plurality of recipe parameters.

18. The non-transitory machine-readable storage medium of claim 15, wherein the graphical representation is a two-dimensional contour map, wherein the two-dimensional contour map comprises contour lines that represent sensitivity values.

19. The non-transitory machine-readable storage medium of claim 15, wherein the processing device further to:
receive a target profile for a third wafer, wherein the target profile is based on target thickness of the third wafer;
analyze the target profile based on the first plurality of sensitivity values; and
determine, based on analyzing of the target profile based on the first plurality of sensitivity values, a new process recipe associated with the target profile.

20. The non-transitory machine-readable storage medium of claim 15, wherein the processing device further to:
receive a second plurality of sensitivity values, wherein the second plurality of sensitivity values is associated with a target chamber;
analyze the first plurality of sensitivity values and the second plurality of sensitivity values; and
modify, based on analyzing of the first plurality of sensitivity values and the second plurality of sensitivity values, the second values for the plurality of recipe parameters, wherein the second values for the plurality of recipe parameters are associated with the target chamber.

* * * * *